United States Patent
Qidwai et al.

(10) Patent No.: US 9,236,107 B1
(45) Date of Patent: Jan. 12, 2016

(54) FRAM CELL WITH CROSS POINT ACCESS

(71) Applicant: Texas Instruments Incorporated, Dallas, TX (US)

(72) Inventors: Saim Ahmad Qidwai, Allen, TX (US); Stephen Keith Heinrich-Barna, Murphy, TX (US); William Francis Kraus, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/324,048

(22) Filed: Jul. 3, 2014

(51) Int. Cl.
*G11C 11/22* (2006.01)
*G11C 5/06* (2006.01)
*G11C 11/56* (2006.01)
*G11C 13/00* (2006.01)

(52) U.S. Cl.
CPC .......... *G11C 11/221* (2013.01); *G11C 11/2273* (2013.01); *G11C 5/06* (2013.01); *G11C 11/22* (2013.01); *G11C 11/2275* (2013.01); *G11C 11/5657* (2013.01); *G11C 13/004* (2013.01)

(58) Field of Classification Search
CPC .. G11C 11/22; G11C 11/221; G11C 11/2273; G11C 11/2275; G11C 11/5657; G11C 13/004; G11C 13/0069; G11C 5/06
USPC .................................................... 365/65, 145
See application file for complete search history.

(56) References Cited

U.S. PATENT DOCUMENTS

| | | | | |
|---|---|---|---|---|
| 5,400,275 | A | * | 3/1995 | Abe et al. ............... 365/145 |
| 6,147,895 | A | * | 11/2000 | Kamp ...................... 365/145 |
| 6,504,747 | B2 | * | 1/2003 | Braun et al. ............. 365/145 |
| 7,652,909 | B2 | | 1/2010 | Du |
| 2004/0213058 | A1 | * | 10/2004 | Shimizu et al. ......... 365/200 |
| 2005/0063214 | A1 | * | 3/2005 | Takashima .............. 365/145 |
| 2007/0058420 | A1 | * | 3/2007 | Ogiwara et al. ........ 365/154 |
| 2008/0007987 | A1 | * | 1/2008 | Takashima .............. 365/145 |
| 2008/0068874 | A1 | * | 3/2008 | Shiga et al. ............. 365/145 |
| 2012/0127776 | A1 | * | 5/2012 | Kawashima ............ 365/145 |

OTHER PUBLICATIONS

K. R. Udayakumar et al, "Manufacturable High-Density 8Mbit one Transistor—One Capacitor Embedded Ferroelectric Random Access Memory, Japanese Journal of Applied Physics", vol. 47, No. 4, 2008, pp. 2710-2713.

* cited by examiner

*Primary Examiner* — Ly D Pham
(74) *Attorney, Agent, or Firm* — John R. Pessetto; Frank D. Cimino

(57) ABSTRACT

A system on chip (SoC) may have an array ferroelectric bit cells. The array may include a plurality of bit cells organized into a plurality of rows and columns. A set of word lines is configured such that one of the plurality of word lines is connected to each bit cell in a row of bit cells. A set of column oriented platelines is provided, wherein each column of bit cells has one of the plurality of platelines connected to each bit cell in the column of bit cells. A set of bitlines is provided, wherein each column of bit cells has one of the plurality of bitlines connected to each bit cell in the column of bit cells. Multiplexors may be used to allow one plateline drivers, bitline drivers, and sense amps to be shared between multiple platelines and bitlines.

6 Claims, 10 Drawing Sheets

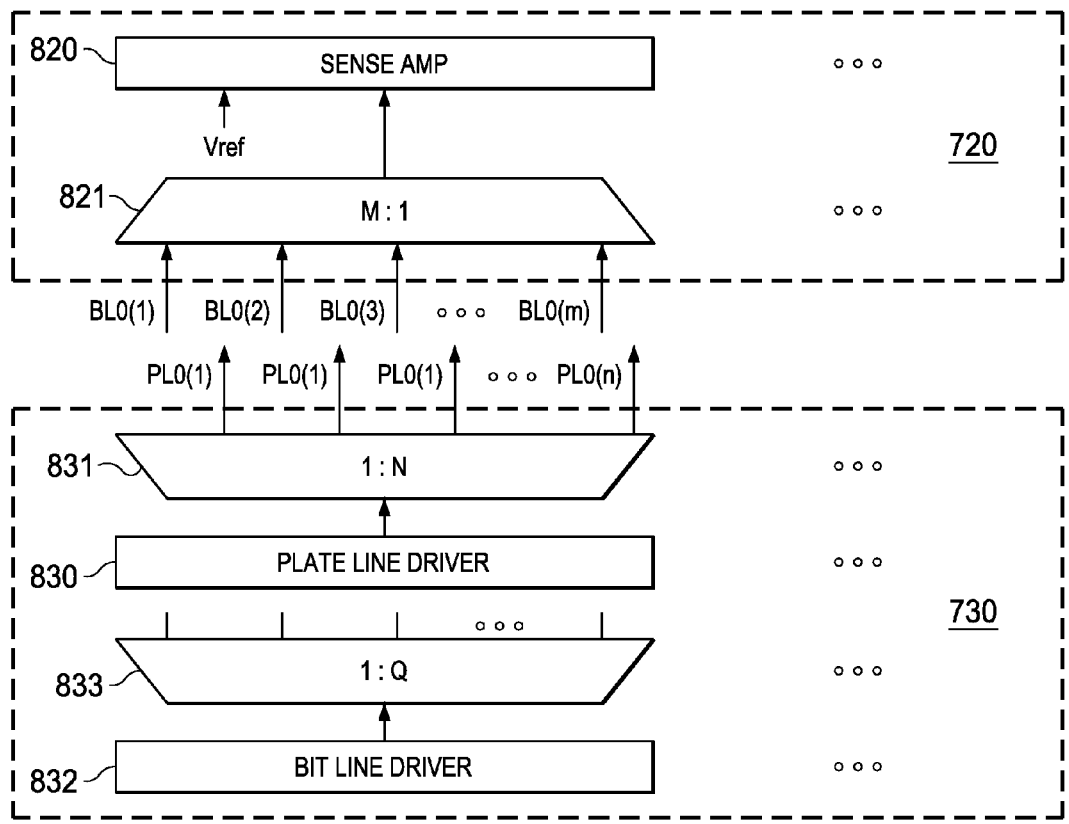
FIG. 8
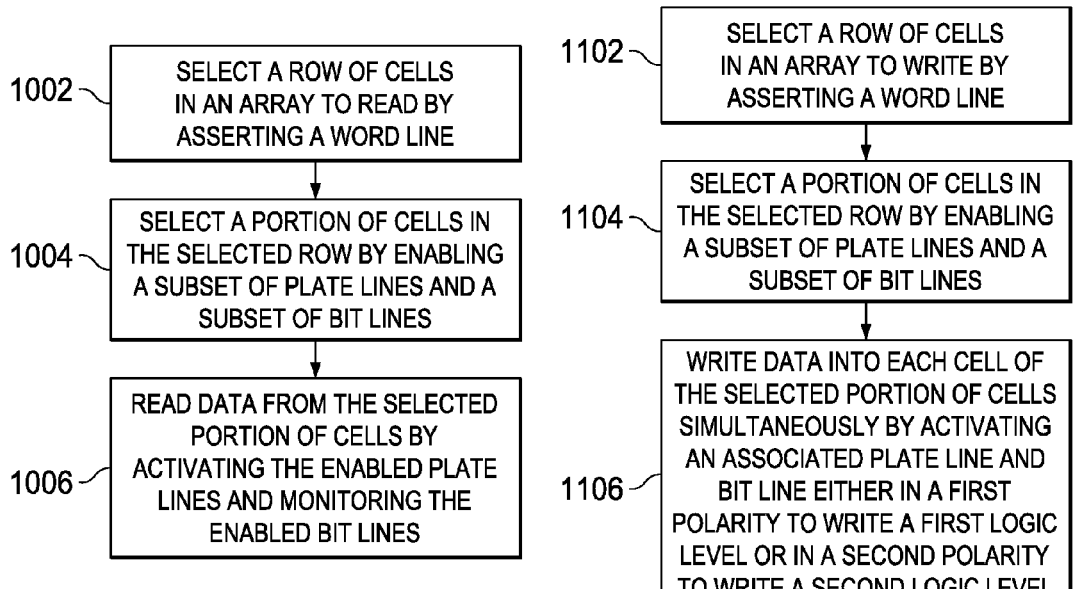
FIG. 10
FIG. 11

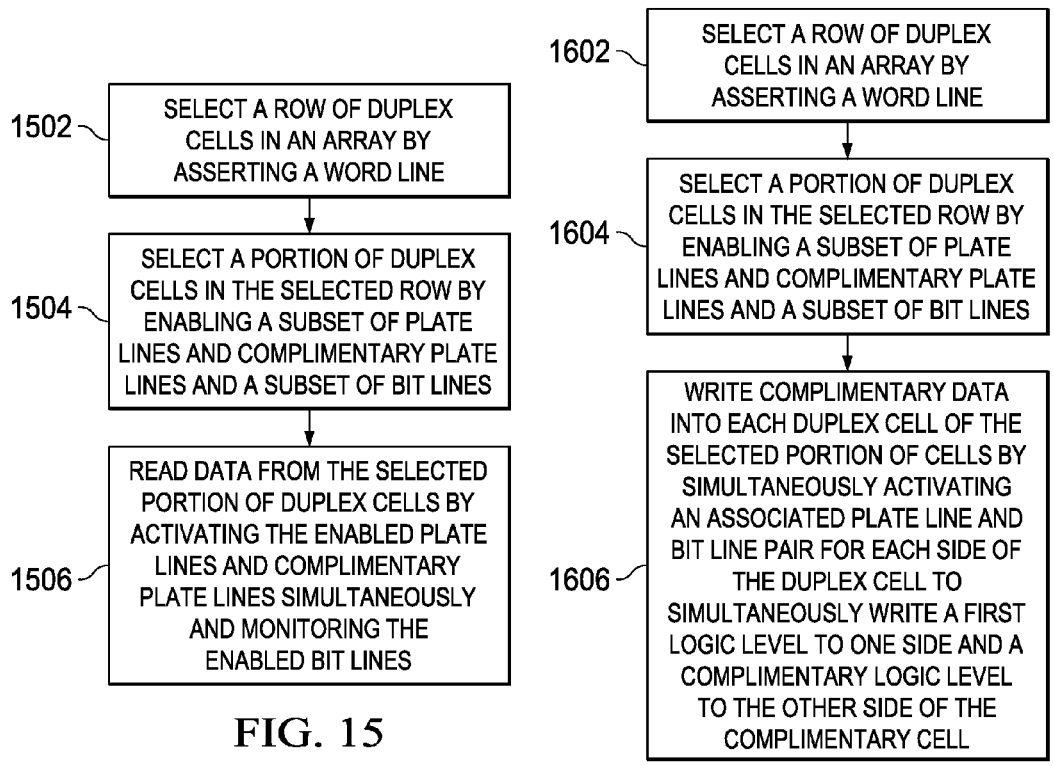
FIG. 15
FIG. 16
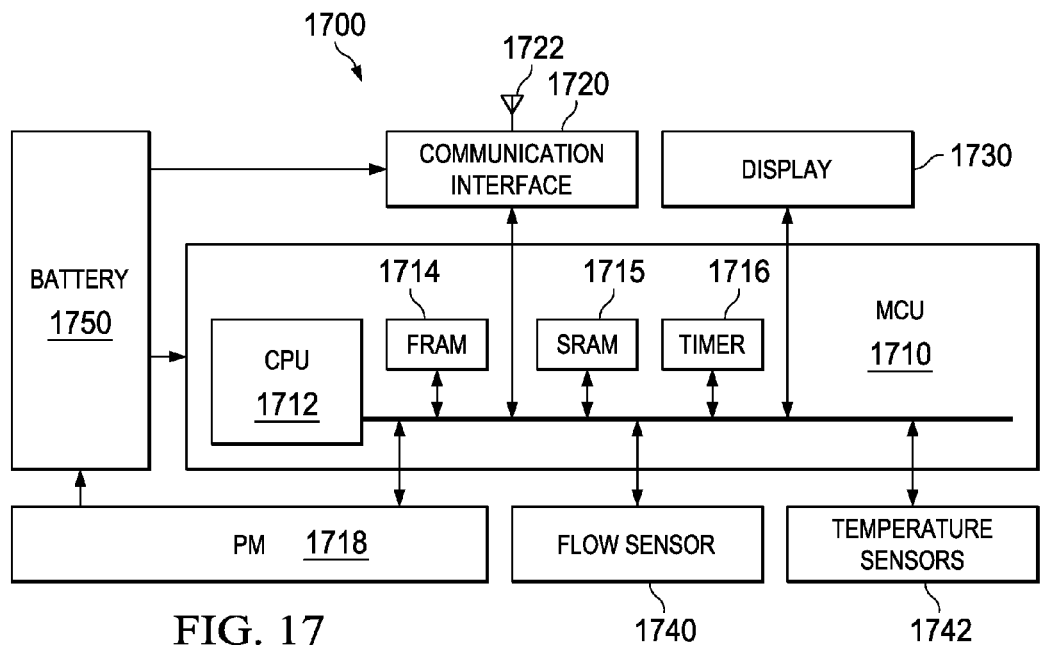
FIG. 17

FRAM CELL WITH CROSS POINT ACCESS

FIELD OF THE INVENTION

This invention generally relates to nonvolatile memory cell arrays, and in particular, to a cell with cross point access.

BACKGROUND OF THE INVENTION

System on Chip (SoC) is now a commonly used concept; the basic approach is to integrate more and more functionality into a given device. Many SoC designs pair a microprocessor core, or multiple cores, with various peripheral devices and memory circuits, some of which may be non-volatile.

Ferroelectric random access memory (FRAM) is a non-volatile memory technology with similar behavior to DRAM (dynamic random access memory). Each individual bit can be accessed, but unlike EEPROM (electrically erasable programmable read only memory) or Flash, FRAM does not require a special sequence to write data nor does it require higher programming voltages. Each ferroelectric memory cell contains one or more ferroelectric capacitors (FeCap).

BRIEF DESCRIPTION OF THE DRAWINGS

Particular embodiments in accordance with the invention will now be described, by way of example only, and with reference to the accompanying drawings:

FIGS. 8-9 illustrate plateline and bitline multiplexing in the FRAM array of FIG. 7;

FIGS. 10-11 are flow charts illustrating operation of a cross-point connected FRAM array;

FIGS. 12-16 illustrate operation of a duplex 2T2C FRAM array having cross point platelines;

FIG. 17 is a block diagram of an SoC that includes a FRAM array with cross point platelines.

Figure 2:
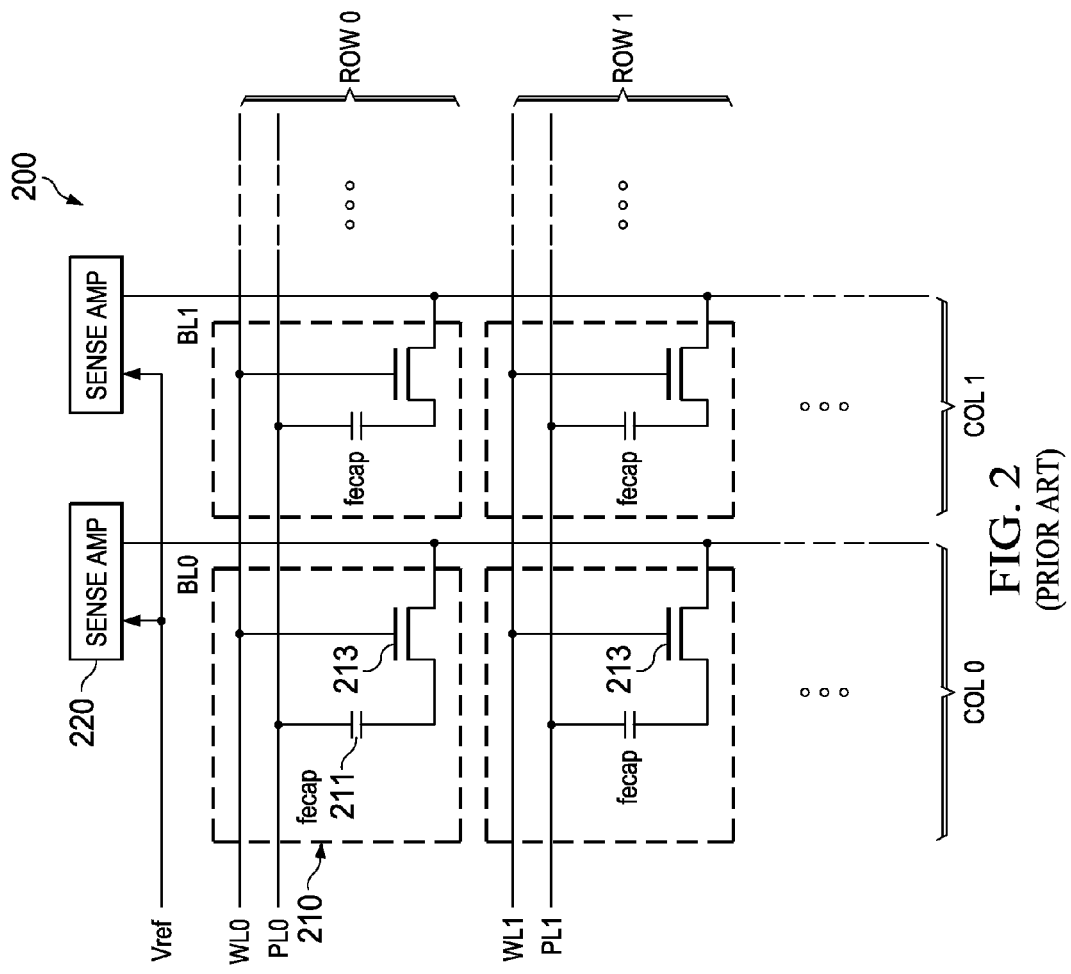
FIGS. 2-4 illustrate a prior art FRAM bitcell and array.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Ferroelectric random access memory (FRAM) is a non-volatile memory technology with similar behavior to DRAM (dynamic random access memory). Each individual bit can be accessed, but unlike EEPROM (electrically erasable programmable read only memory) or Flash, FRAM does not require a special sequence to write data nor does it require higher programming voltages. Each ferroelectric memory cell contains one or more ferroelectric capacitors (FeCap).

Previously, FRAM bitcell arrays were designed to have a horizontal wordline and plateline for each row of an array, and therefore has a limitation that the widest segment on a row is a word width, such as 64 data bits+15 parity bits, for example. This reduces area efficiency because a large memory array may require many segments that are each a one word wide array. Additional wordline and plateline drivers are required for each of the multiple segments. Also, the breaks in the FRAM array between segments may require more dummy columns which compounds the problem. Therefore, FRAM may become less competitive with competing memory technologies and more expensive due to the large area requirements.

Embodiments of the invention provide an FRAM bitcell with a vertical, column oriented plateline that is oriented perpendicularly to the wordlines (WL) such that every bitline (BL) has its own plateline (PL). This creates a cross point FRAM array where a bitcell may be accessed by selecting a single horizontal WL and a single vertical PL. This eliminates the word-length limitation in the row-direction on the size of the array and therefore allows a larger array. A larger array increases area efficiency and also improves FeCap consistency as there are fewer breaks in the area. Although it may seem like having a plateline for every column would cause an increase in area for the signal lines and associated driver circuits, the overall area may decrease by employing a column mux for bitline and plateline pairs. 8:1 multiplexing may be used, for example. A design for an 256 kbit array achieved an area reduction on the order of 35% area over a prior art FRAM using a same process technology by using a cross point bitcell architecture with 8:1 multiplexing, for example.

For an array in which the bitcells store complimentary values that are sensed by a differential sense amplifier, having cross point platelines allows both sides of a duplex bitcell to be written at the same time using a common timing pulse. A design for such an array achieved a cycle time reduction on the order of 40 ns over a prior art FRAM using a same process technology by using a cross point bitcell architecture with the simultaneous write feature, for example.

For FeCap based circuits, reading data from the FeCaps may partially depolarize the capacitors. For this reason, reading data from FeCaps is considered destructive in nature; i.e. reading the data may destroy the contents of the FeCaps or reduce the integrity of the data at a minimum. For this reason, if the data contained in the FeCaps is expected to remain valid after a read operation has occurred, the data must be written back into the FeCaps. Thus, each read cycle also requires a write cycle. Reducing write cycle time will therefore also reduce read cycle time.

Figure 1:
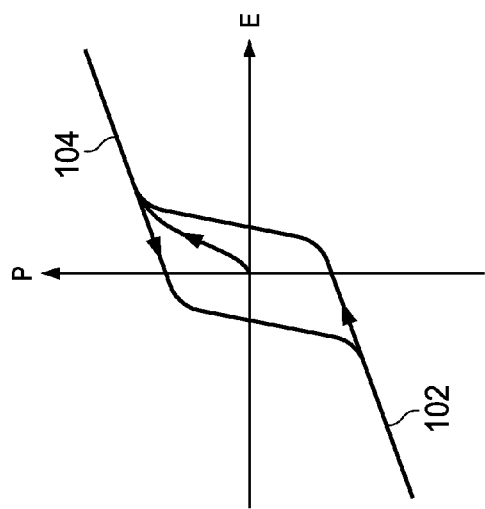
FIG. 1 is a plot illustrating polarization hysteresis exhibited by a ferroelectric capacitor.

FIG. 1 is a plot illustrating polarization hysteresis exhibited by a ferroelectric capacitor. The general operation of ferroelectric bit cells is known. When most materials are polarized, the polarization induced, P, is almost exactly proportional to the applied external electric field E; so the polarization is a linear function, referred to as dielectric polarization. In addition to being nonlinear, ferroelectric materials demonstrate a spontaneous nonzero polarization as illustrated in FIG. 1 when the applied field E is zero. The distinguishing feature of ferroelectrics is that the spontaneous polarization can be reversed by an applied electric field; the polarization is dependent not only on the current electric field but also on its history, yielding a hysteresis loop. The term "ferroelectric" is used to indicate the analogy to ferromagnetic materials, which have spontaneous magnetization and also exhibit hysteresis loops.

The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. After the charge is removed, the dipoles retain their polarization state. Binary "0"s and "1"s are stored as one of two possible electric polarizations in each data storage cell. For example, in the figure a "1" may be encoded using the negative remnant polarization 102, and a "0" may be encoded using the positive remnant polarization 104, or vice versa.

Embodiments of the invention may use various configurations of FRAM cells. For example, some SoC's may include a large array of non-volatile FRAM cells for storing processor instructions and data, for example. In this case, each FRAM cell may be a simple 1T1C cell, for example. A one transistor one capacitor (1T1C) storage cell design in an FRAM array is similar in construction to the storage cell in widely used DRAM in that both cell types include one capacitor and one access transistor. In a DRAM cell capacitor, a linear dielectric is used, whereas in an FRAM cell capacitor the dielectric structure includes ferroelectric material, typically lead zirconate titanate (PZT). The general construction of 1T1C cells is well known; for example, an 8 Mbit array using 1T1C cells is described in "Manufacturable High-Density 8 Mbit One Transistor-One Capacitor Embedded Ferroelectric Random Access Memory", K. R. UDAYAKUMAR, et al, published Apr. 25, 2008, and is incorporated by reference herein.

FIG. 2 is a schematic illustrating a prior art FRAM array 200 that contains bitcells 210. Bitcell 210 includes one ferroelectric capacitor (FeCap) and one pass-transistor (1T1C). Array 200 includes many rows of bitcells; in this example each row of bitcells provides storage for a 64 bit data word. In this example, bitcell 210 represents bit 0 in word 0 of array 200. One side of FeCap 211 is coupled to row oriented plateline PL0 by pass-gate 213. The other side of FeCap 211 is coupled to respective bitline BL0 and thereby to a sense amp 220 that compares a voltage on BL0 with a reference voltage during a read cycle. In this example, each column of bitcells is coupled to one sense amp.

Figure 3:
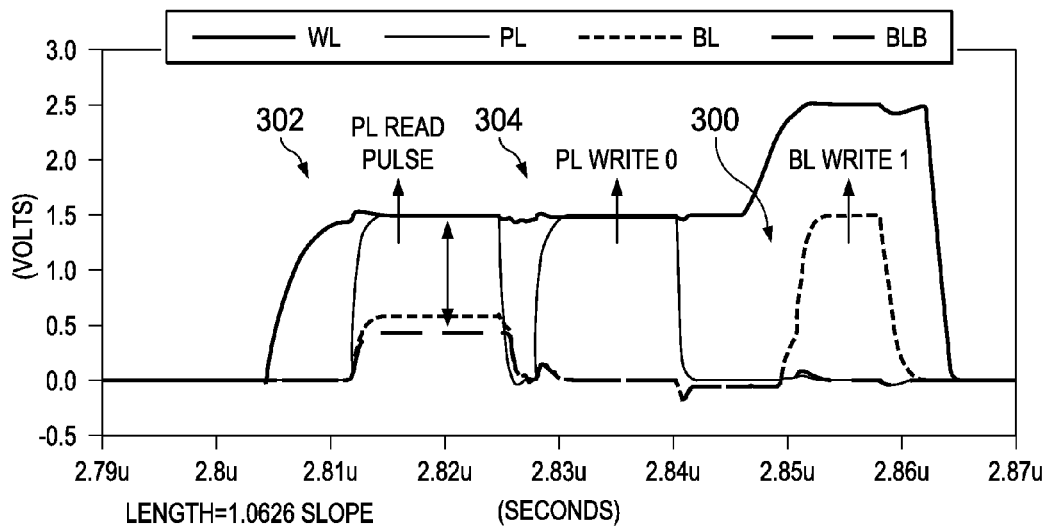

Row 0 of array 200 may be read by asserting wordline WL0 that is coupled to a control terminal on the pass-gate 213 of each bitcell in row 0. While the wordline is active, row oriented plateline PL0 is also activated, which causes the charge that was stored in each FeCap in row 0 to be dumped onto an associated bitline and then sensed by an associated sense amp 220, as indicated at 302 in FIG. 3

Similarly, row 0 of array 200 may be written by asserting wordline WL0 to enable pass-gate 213 of each bitcell in row 0 and then writing to all bits that will have a logic "0" during a first time cycle and then writing to all bits that will have a logic "1" during a second time cycle, or vice versa. To write a logic 0 to a bitcell, a field is impressed in one direction across FeCap 211 of each bitcell in the row that is to be written to logic 0 by holding the plateline high for the entire row while the bitline coupled to that bitcell is held low, for example, as illustrated at 304 of FIG. 3. To write a logic 1 to a bit cell, a field is impressed in an opposite direction across FeCap 211 of each bitcell in the row that is to be written to logic 1 by holding the plateline low for the entire row while the bitline coupled to that bitcell is held high, for example, is indicated at 306. These are examples; the logic values may be reversed. One field direction represents a bit value of logical "0" while the opposite field direction represents a logical "1". As can be seen from FIG. 3, it takes two write cycles to write all bitcells in the row.

Figure 4:
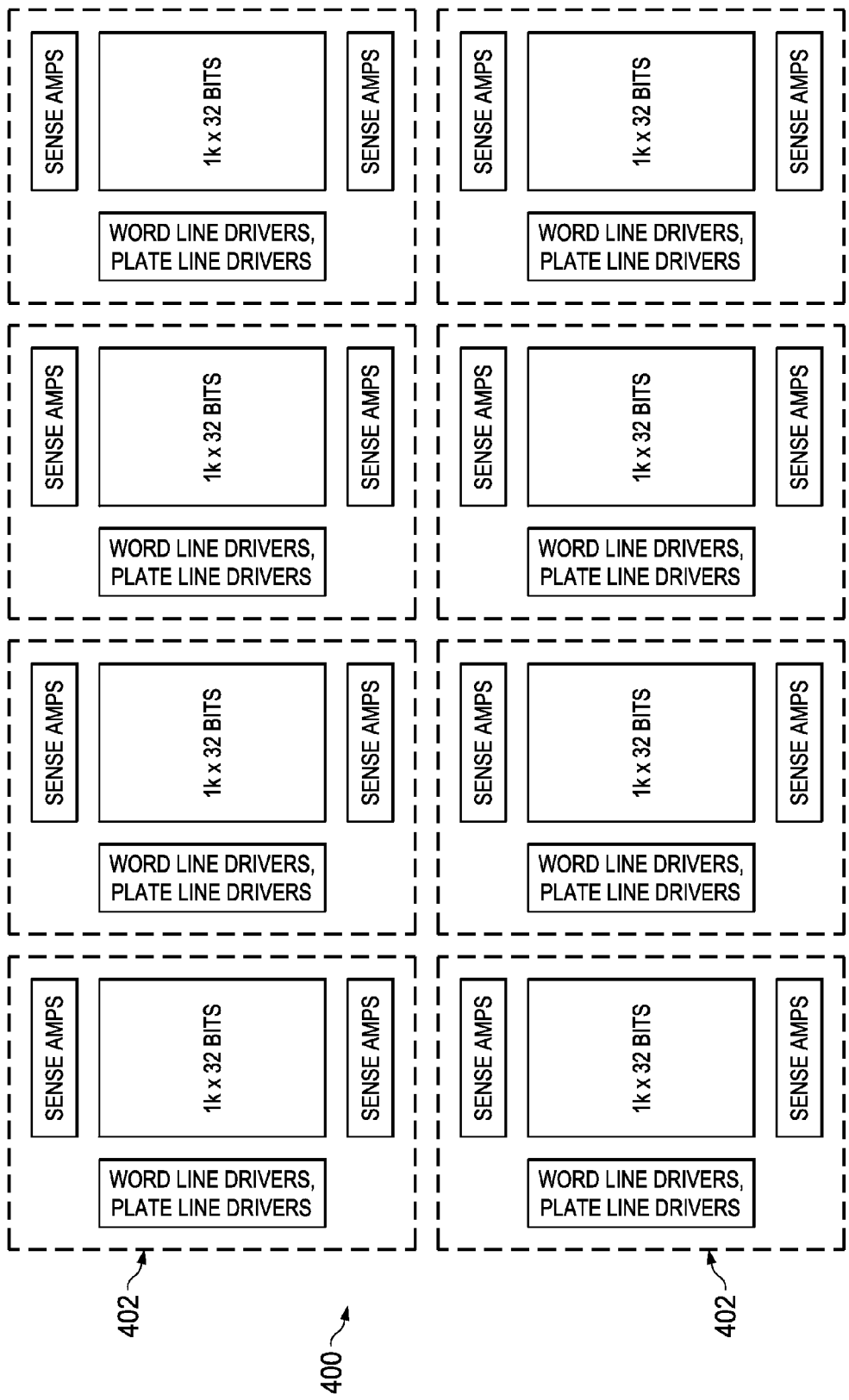

FIG. 4 illustrates a prior art large FRAM array 400 using prior art bitcells 210. Array 400 includes multiple segments 402 that are each similar to array 200. Each segment 200 has a row length that is limited to one data word, such as 64 bits in this example.

Figure 6:
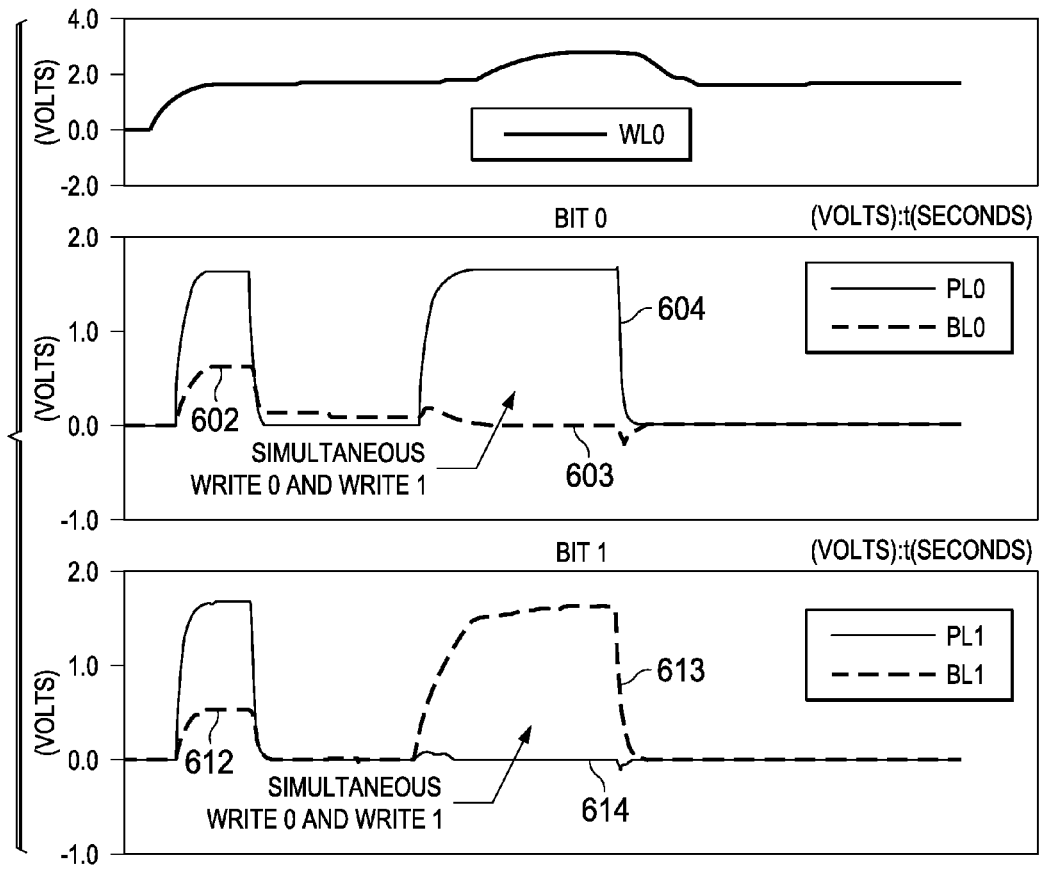
FIGS. 5-7 illustrate operation of a 1T1C FRAM cell and FRAM array having cross point platelines.
Figure 5:
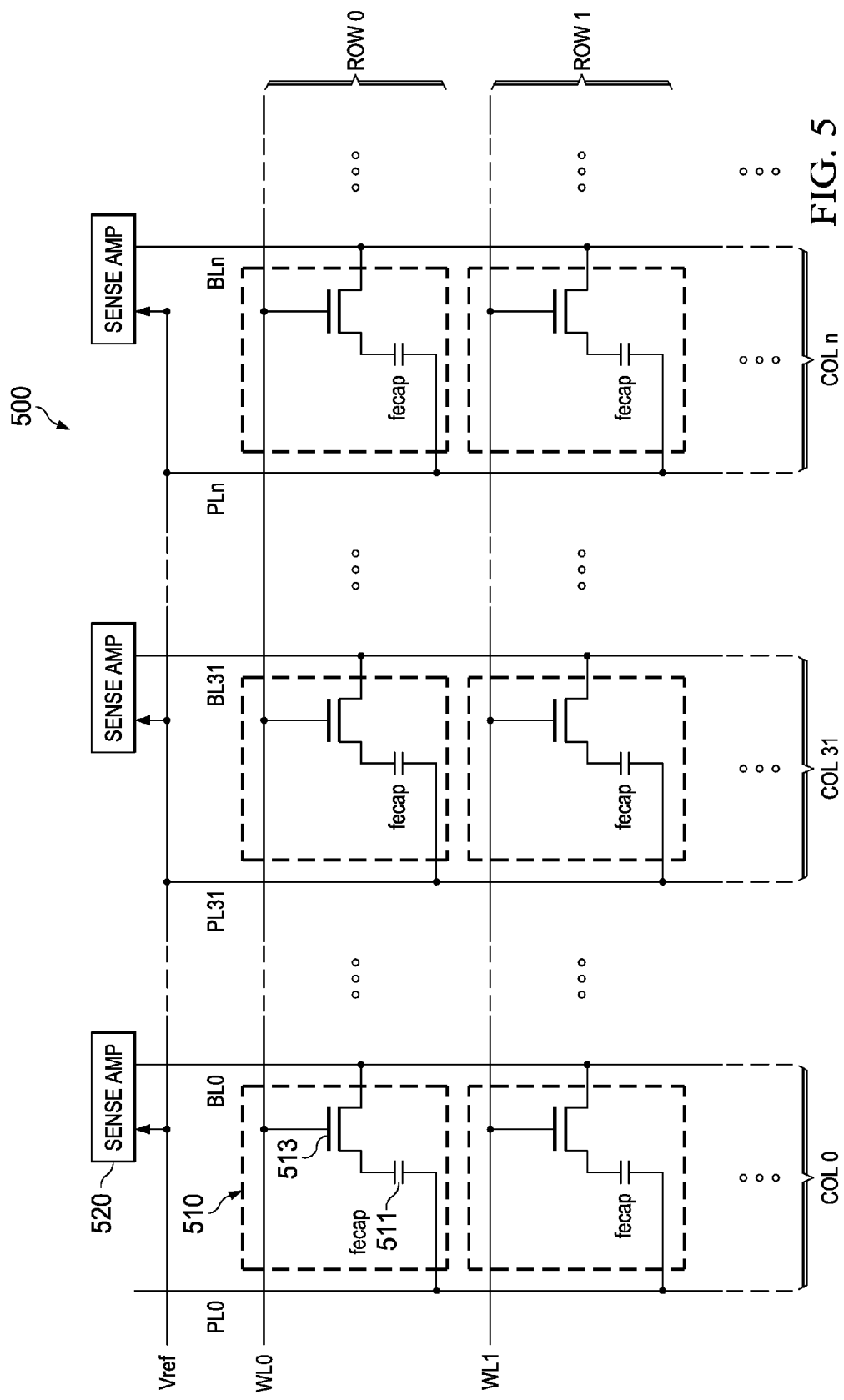
Figure 7:
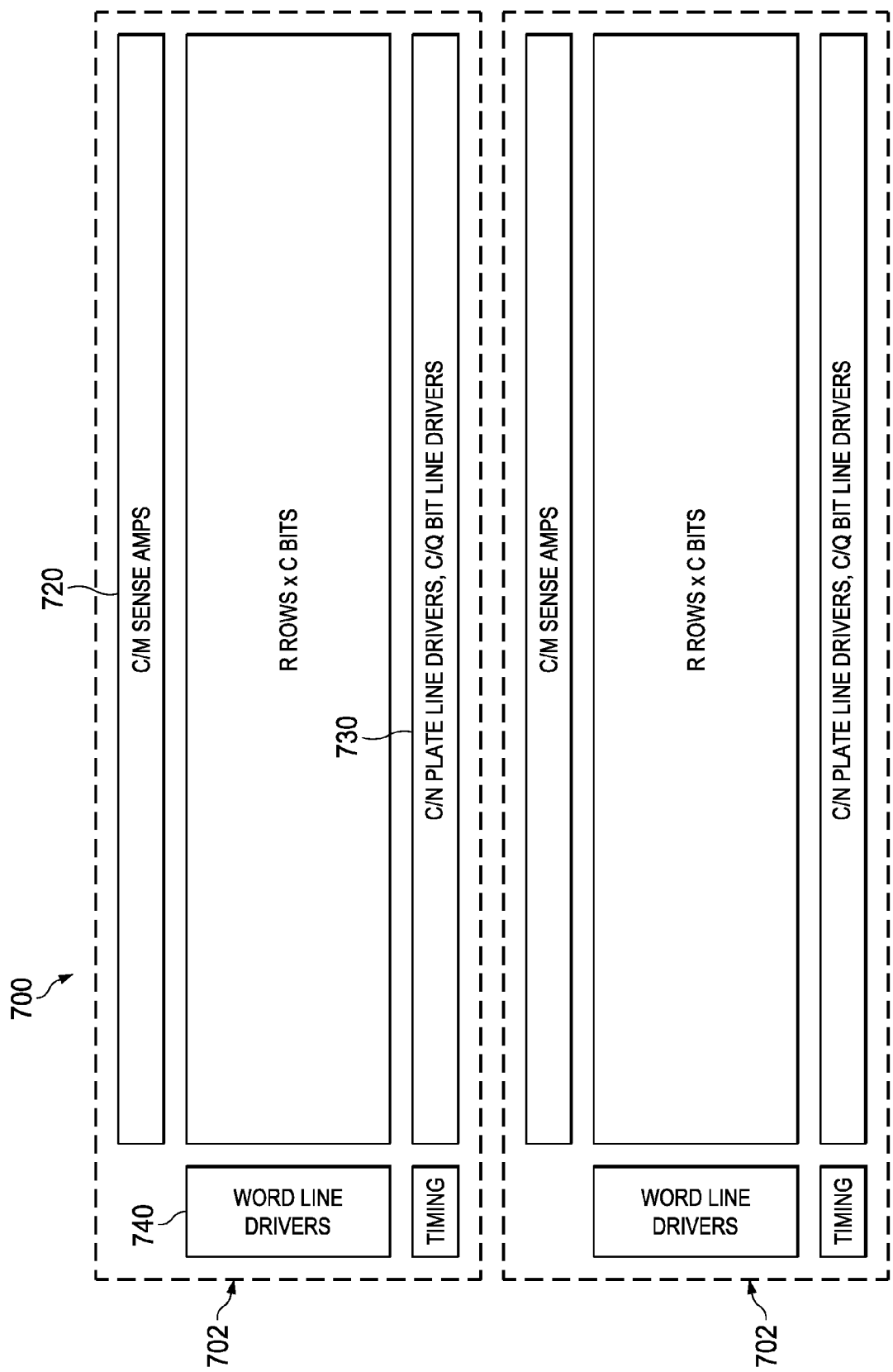

FIGS. 5-7 illustrate operation of a 1T1C FRAM cell 510 and FRAM array 500 having cross point platelines. Bitcell 510 includes one FeCap 511 and one pass-transistor 513. Array 500 includes many rows of bitcells; in this example, bitcell 510 represents bit 0 in row 0 of array 500. One side of FeCap 511 is coupled to column oriented plateline PL0. The other side of FeCap 511 is coupled to respective column oriented bitline BL0 by pass gate 513 and thereby to a sense amp 220 that compares a voltage on BL0 with a reference voltage during a read cycle. In this example, each column of bitcells is coupled to one sense amp.

Array 500 includes a plateline for every column, such that there is a plateline in parallel with each bitline. This allows a row of bitcells to be longer than one word, because the platelines may be selectively activated to allow only a portion of any row to be accessed at a time. In this example, each row of bitcells may provide storage for 300-400 bits, for example, which may represent storage for eight or more 32 bit words, for example. In general, the length of the row may now be determined by the capacitive load of the pass gates and intrinsic capacitance of the wordline, as compared to the drive strength of the wordline driver, for example.

A word in row 0 of array 500 may be read by activating wordline WL0 that is coupled to a control terminal on the pass-gate 513 of each bitcell in row 0. While the wordline is active, a set of platelines, such as PL0-PL31, corresponding to the bits in the selected word is also activated, which causes the charge that was stored in each FeCap in bitcells 0-31 in row 0 to be dumped onto an associated bitline and then sensed by an associated sense amp 520, as indicated at 602, 612 in FIG. 6. FIG. 6 illustrates timing for bitcells in column 0 and 1, which is representative of all of the bitcells for bits 0-31 in row 0, for example. While the word line is activated across the entire row 0, the platelines and bitlines in the other bitcells in row 0 remain inactive at a quiescent voltage level, such as a low logic level, for example.

Similarly, a word in row 0 of array 500 may be written by asserting the wordline to enable pass-gate 513 of each bitcell in row 0. All bits in the word that will have a logic "0" and all bits that will have a logic "1," may be written simultaneously by controlling the bitline and plateline pair provided for each bitcell. To write a logic 0 to a bitcell, a field is impressed in one direction across FeCap 511 of each bitcell in the word that is to be written to logic 0 by holding the plateline for that bit column high while the companion bitline for that bit column is held low, for example, as illustrated at 603, 604 of FIG. 6. To write a logic 1 to a bit cell, a field is impressed in an opposite direction across FeCap 511 of each bitcell in the word that is to be written to logic 1 by holding the plateline for that bit column low while the companion bitline for that bit column is held high, for example, is indicated at 613, 614. These are examples; the logic values may be reversed. One field direction represents a bit value of logical "0" while the opposite field direction represents a logical "1". As can be seen from FIG. 6, write cycles for logic 0 and for logic 1 may be performed simultaneously because there is a plateline/bitline pair for each column of bitcells.

As mentioned above, reading data from the FeCaps may partially depolarize the capacitors. For this reason, reading data from FeCaps is considered destructive in nature. For this reason, if the data contained in the FeCaps is expected to remain valid after a read operation has occurred, the data must be written back into the FeCaps. Thus, each read cycle also requires a write cycle. Reducing write cycle time will therefore also reduce read cycle time.

FIG. 7 illustrates a large FRAM array 700 using bitcells 510. Array 700 includes multiple segments 702 that are each similar to array 500. Each segment 500 has a row length that may extend for multiple data words, such as 300-400 bits, for example. Each segment 702 includes a bank of wordline drivers 740, where there may be a wordline driver for each row, for example. Each segment 702 also includes a bank of column oriented plateline and bitline drivers 730 and a bank of sense amps 720.

As will be explained in more detail below, multiple platelines may be multiplexed and be driven by a single plateline driver. Multiple bitlines may be multiplexed and be driven by a single bitline driver. Similarly, multiple bitlines may be multiplexed and served by a single sense amp. As mentioned above, a design for an 256 kbit array achieved an area reduction on the order of 35% area over a prior art FRAM using a same process technology by using a cross point bitcell architecture with 8:1 multiplexing, for example.

Figure 9:
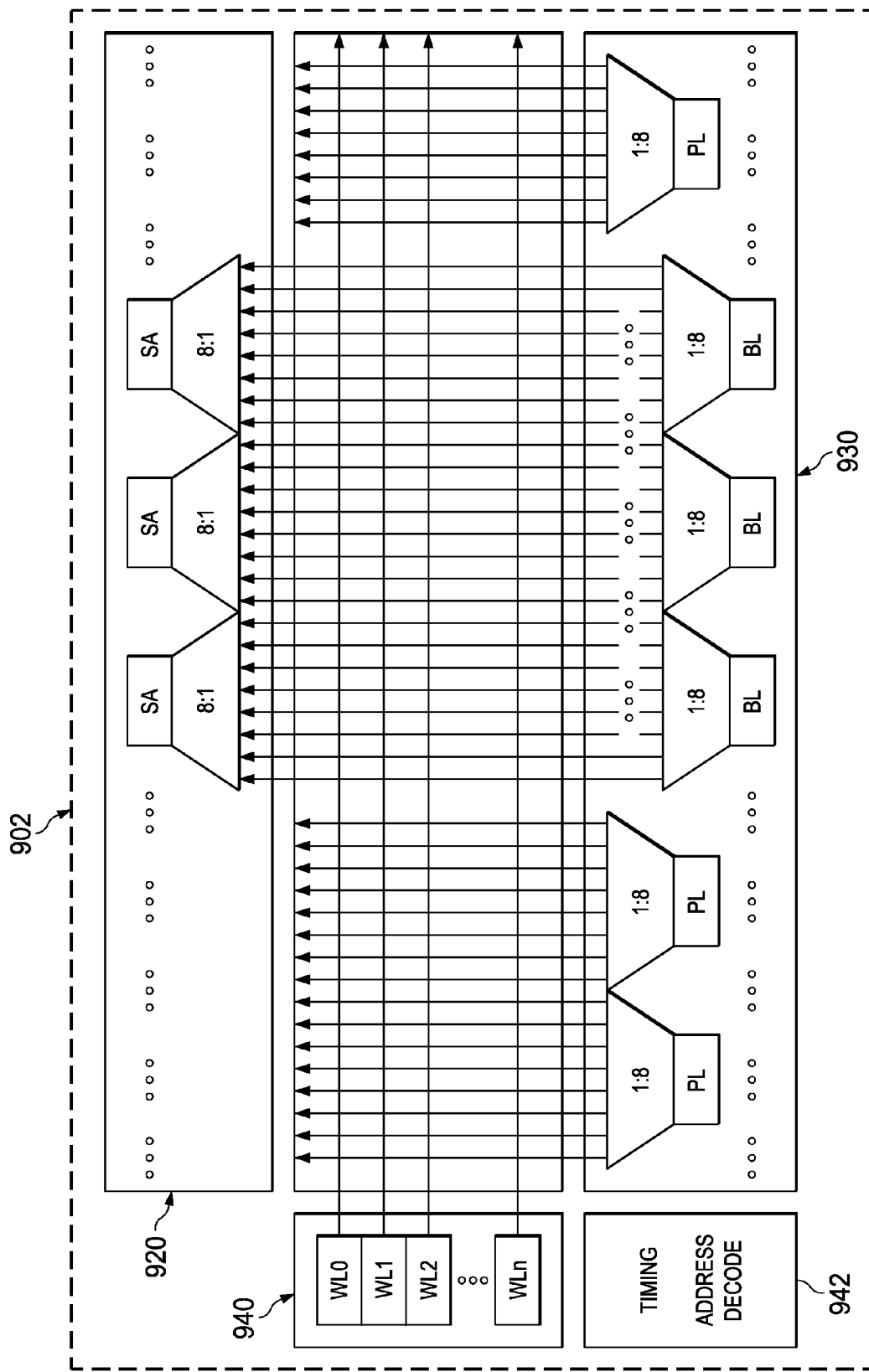

FIGS. 8-9 illustrate plateline and bitline multiplexing in the FRAM array 700 of FIG. 7. In this example, driver bank 730 includes a plateline driver coupled to a 1:N selector that selectively couples the output of plateline driver 830 to 1 of N platelines. N may be selected based on design constraints for a given array. The larger N is, the smaller is the number of plateline drivers needed for an array segment 702. For example, for an array that has C columns, only C/N plateline drivers are needed. Similarly, driver bank 730 includes a bitline driver coupled to a 1:Q selector that selectively couples the output of bitline driver 830 to 1 of Q bitlines. Q may be selected based on design constraints for a given array. The larger Q is, the smaller is the number of plateline drivers needed for an array segment 702. For example, for an array that has C columns, only C/Q bitline drivers are needed.

In this example, sense amp bank 720 includes a sense amp 820 coupled to a 1:M selector 821 that selectively couples the input of sense amp 820 to 1 of M bitlines. M may be selected based on design constraints for a given array. The larger M is, the smaller is the number of sense amp needed for an array segment 702. For example, for an array that has C columns, only C/M sense amps are needed.

FIG. 9 illustrates an array segment 902 in which Q=8 for sense amp bank 920, and M and N=8 for driver bank 930. Timing circuitry and address decoding circuitry 942 may produce various timing and control signals to control the operation of driver and sense amp banks 920, 930, 940 based on address signals provided to array 902, for example. As mentioned above, a design for an 256 kbit array achieved an area reduction on the order of 35% area over a prior art FRAM using a same process technology by using a cross point bitcell architecture with 8:1 multiplexing, for example.

FIG. 10 is a flow chart illustrating operation of a read cycle in a cross-point connected FRAM array, such as array segment 902 in FIG. 9. As described above, the array of bit cells is arranged in rows and columns. A row of bit cells is selected 1002 by asserting a word line coupled to each bit cell in the selected row of bit cells. This may be done by enabling a wordline driver to drive a selection signal onto the selected word line, while keeping all other wordline drivers connected to other rows in the array turned off.

A portion of bit cells in the selected row is selected 1004 by enabling a subset of bitlines and a subset of platelines. As described in more detail above, each column of the array has a separate plateline and a separate bitline. Data may be read 1006 from each bit cell of the selected portion of bit cells by activating a set of sense amps coupled to the subset of bitlines.

As described in more detail above, selector circuits may be provided to select and enable a subset 1004 of the platelines and bitlines such that fewer plateline drivers and are required to drive the column oriented platelines. Similarly, selector circuits may be provided to select a subset of bitlines such that fewer sense amps are required to sense the column oriented bitlines.

FIG. 11 is a flow chart illustrating operation of a write cycle in a cross-point connected FRAM array, such as array segment 902 in FIG. 9. As described above, the array of bit cells is arranged in rows and columns. A row of bit cells is selected 1102 by asserting a word line coupled to each bit cell in the selected row of bit cells. This may be done by enabling a wordline driver to drive a selection signal onto the selected word line, while keeping all other wordline drivers connected to other rows in the array turned off.

A portion of bit cells in the selected row is selected 1104 by enabling a subset of bitlines and a subset of platelines. As described in more detail above, each column of the array has a separate plateline and a separate bitline. Data may be written 1106 into each cell of the selected portion of cells simultaneously by activating an associated column oriented plateline and bitline either in a first polarity to write a first logic level or in a second polarity to write a second logic level.

As described in more detail above, selector circuits may be provided to select and enable a subset 1104 of the platelines and bitlines such that fewer plateline and bitline drivers are required to drive the column oriented platelines and bitlines.

FIGS. 12-16 illustrate operation of a FRAM array 1202 that has duplex 2T2C bit cells 1210 with cross point platelines. Duplex bitcell 1210 includes two ferroelectric capacitors (FeCaps) 1211, 1212 and two pass-transistors 1213, 1214. Array 1202 includes many rows of bitcells; in this example each row of bitcells provides storage for 300-400 bits, for example. In this example, bitcell 1210 represents bit 0 in row 0 of array 1202. The two FeCaps 1201, 1212 are arranged as a pair in a differential arrangement and coupled to respective bitlines BLA(0), BLB(0) and thereby to a differential sense amp 1220. In this example, each column of duplex bitcells is coupled to one sense amp. Alternatively, the passgates may be placed between the FeCaps and the bitlines, as illustrated in FIG. 5.

Duplex bitcell 1210 may be read by asserting wordlines WLA0, WLB0 that are coupled to a control terminal on pass-gates 1213, 1214 of all of the duplex bitcells in the row. In some embodiments, a single wordline may be used to activate both pass-gates. While the wordlines are active, column oriented duplex platelines PLA0, PLB0 are also activated, which causes any charge that was stored in FeCaps 1211, 1212 to be dumped onto the bitlines and then differentially sensed by sense amp 1220, as illustrated at 1350, 1351 in FIG. 13.

Figure 13:
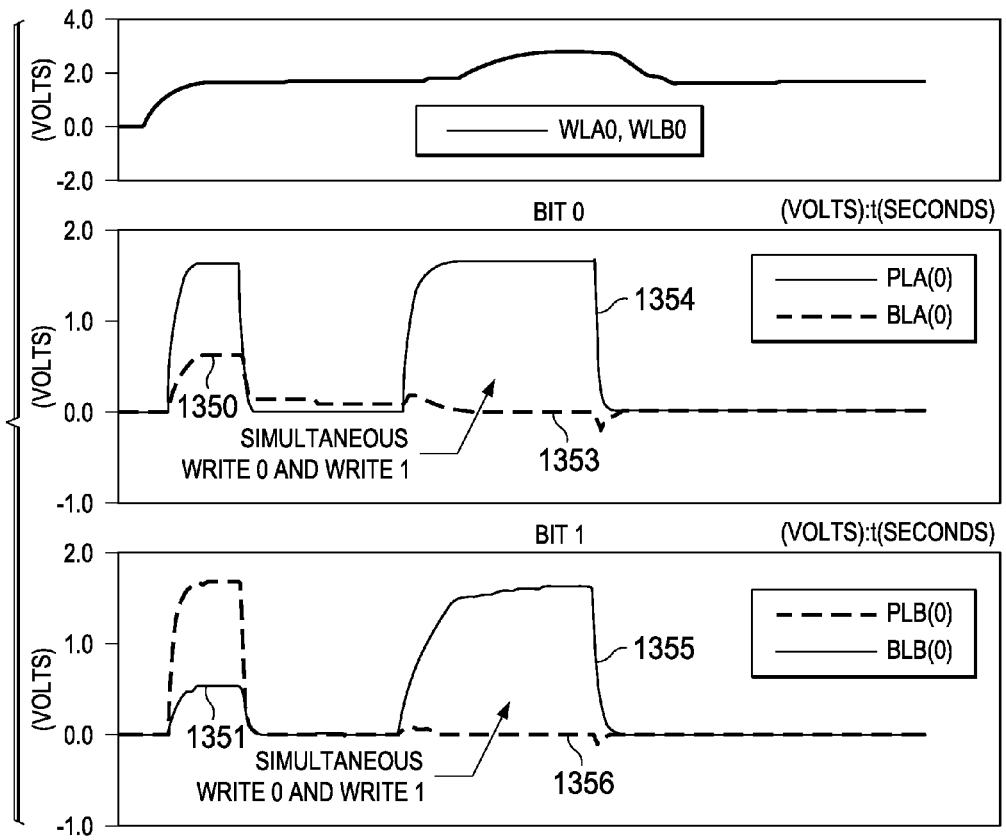

Duplex bitcell 1210 may be written by asserting wordlines WLA0, WLB0 to enable pass-gates 1213, 1214 of all of the duplex bitcells in the row and then impressing a field across FeCap 1211 in one direction using column oriented plateline PLA0 and bitline BLA(0) and while simultaneously impressing an inverse field across FeCap 1212 using column oriented plateline PLB0 and bitline BLBA(0) as illustrated at 1353-1356 in FIG. 13. One pair of fields represents a bit value of logical "0" while the opposite pair of fields represents a logical "1". As can be seen from FIG. 13, write cycles for logic 0 and for logic 1 may be performed simultaneously because there is a plateline/bitline pair for each column of bitcells.

As mentioned above, reading data from the FeCap's may partially depolarize the capacitors. For this reason, if the data contained in the FeCap's is expected to remain valid after a read operation has occurred, the data must be written back into the FeCaps. Thus, each read cycle also requires a write cycle. Reducing write cycle time will therefore also reduce read cycle time.

Figure 14:
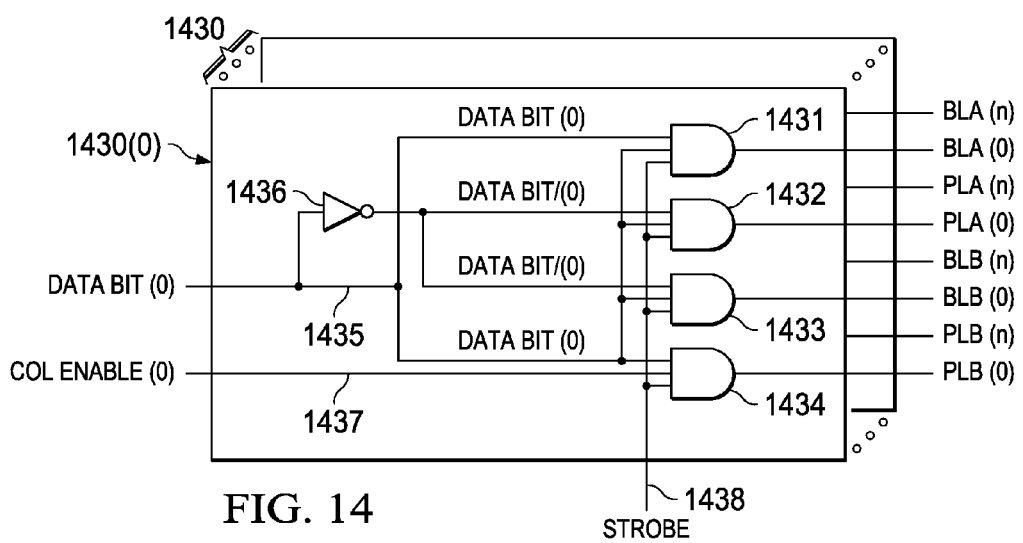

FIG. 14 is a schematic illustrating a configuration for a bank 1430 of n sets of duplex plateline and bitline drivers for array 1202. This is analogous to driver bank 930 of array segment 902, for example. Driver set 1430(0) represents drivers for column 0, for example. Column enable signal 1437 may be produced by timing and decoding logic such as 945, for example, to enable column 0, for example. Strobe signal 1438 may also be produced by timing and decoding logic 945 and provided to multiple columns, for example. Column enable signal may also be part of a set of selector control signals for controlling a selector, such as selectors 831, 833 referring back to FIG. 8.

Data signal 1435 represents data bit (0) which is provided to column 0. It may also be provided to several other columns since each row may contain multiple words of data. For example, in an array with eight way multiplexing, data signal 1435 would be provided to eight columns. Data signal 1435 is provided to bitline driver BLA(0) 1431. Data signal 1435 is also inverted by inverter 1436 and then provided to bitline driver BLB(0) 1433, since in this example complimentary data is provided to each duplex bitcell.

Data signal 1435 is also provided to plateline driver PLB (0) 1434, while the inverted data is also provided to plateline driver PLA(0) 1432. In this manner, complimentary data is provided to each half of the duplex bitcells in column 0 and may be written into both halves of a duplex bitcell simultaneously when strobe signal 1438 is pulsed, as described in more detail above.

Figure 12:
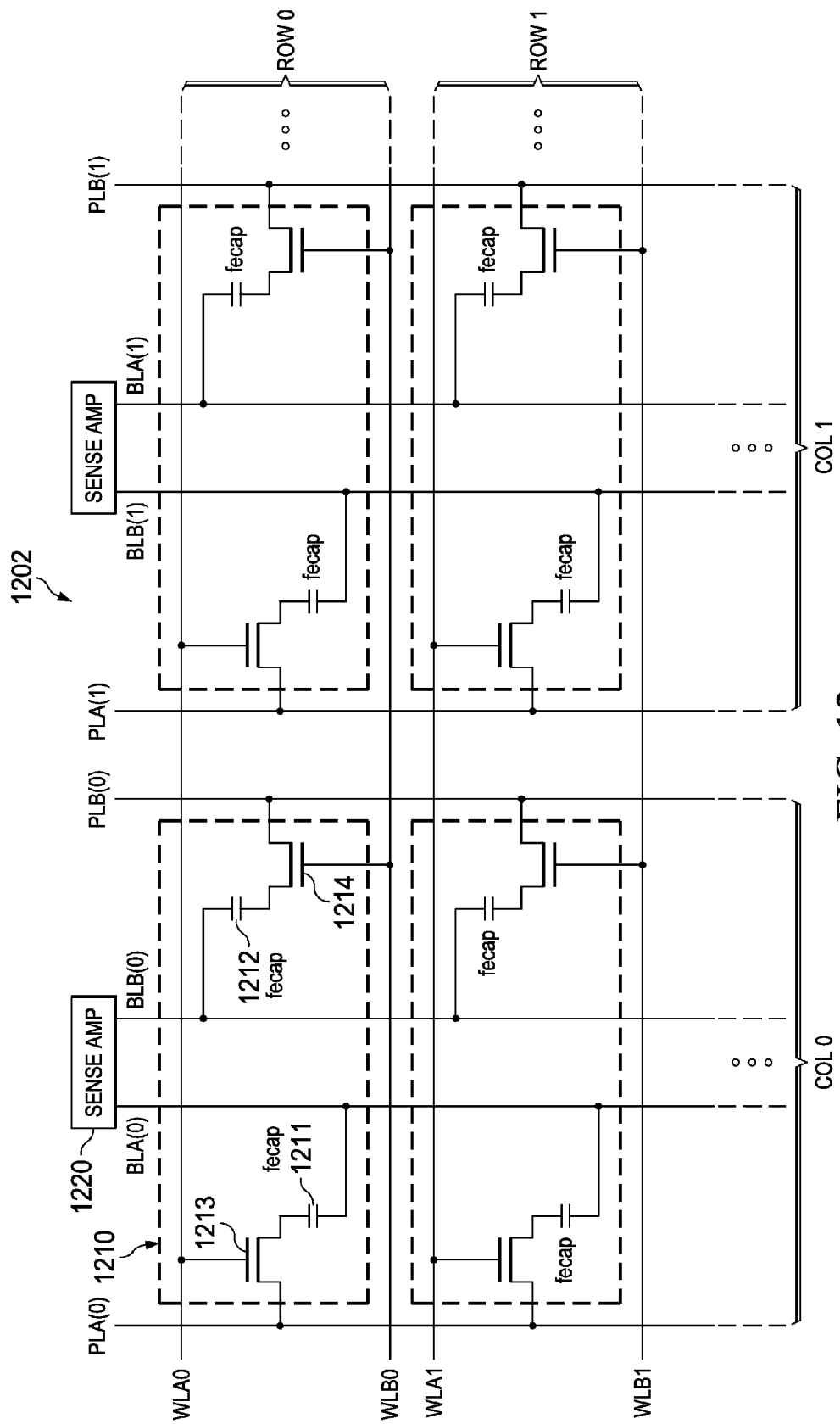

FIG. 15 is a flow chart illustrating operation of a read cycle in a cross-point connected FRAM array, such as array segment 1202 in FIG. 12. As described above, the array of duplex bit cells is arranged in rows and columns. A row of duplex bit cells may be selected 1502 by activating a word line coupled to each bit cell in the selected row of duplex bit cells. This may be done by enabling a wordline driver to drive a selection signal onto the selected word line, while keeping all other wordline drivers connected to other rows in the array turned off. As discussed above in more detail, both halves of a duplex bitcell may be connected to a single word line or each half may be coupled to separate ones of a pair of word lines.

A portion of duplex bit cells in the selected row is selected 1504 by enabling a subset of bitlines and a subset of platelines. As described in more detail above, each column of the array has a separate plateline and a separate bitline for each half of the duplex bitcell. Data may be read 1506 from each duplex bit cell of the selected portion of bit cells by activating a set of sense amps coupled to the subset of bitline pairs.

As described in more detail above, selector circuits may be provided to select and enable a subset 1504 of the platelines and bitlines such that fewer plateline drivers and are required to drive the column oriented platelines. Similarly, selector circuits may be provided to select a subset of bitlines such that fewer sense amps are required to sense the column oriented bitlines.

FIG. 16 is a flow chart illustrating operation of a write cycle in a cross-point connected FRAM array, such as array segment 1202 in FIG. 12. As described above, the array of bit cells is arranged in rows and columns. A row of duplex bit cells is selected 1602 by activating a word line coupled to each bit cell in the selected row of bit cells. This may be done by enabling a wordline driver to drive a selection signal onto the selected word line, while keeping all other wordline drivers connected to other rows in the array turned off. As discussed above in more detail, each both halves of a duplex bitcell may be connected to a single word line or each half may be coupled to separate ones of a pair of word lines.

A portion of duplex bit cells in the selected row is selected 1604 by enabling a subset of bitlines and a subset of platelines. As described in more detail above, each column of the array has a separate plateline and a separate bitline for each half of a duplex bitcell. Complimentary data may be written 1606 into each duplex cell of the selected portion of cells by simultaneously activating an associated plateline and bitline pair for each side of the duplex cell to simultaneously write a first logic level to one side and a complimentary logic level to the other side of the complimentary cell.

As described in more detail above, selector circuits may be provided to select and enable a subset 1604 of the platelines and bitlines such that fewer plateline and bitline drivers are required to drive the column oriented platelines and bitlines.

System Example

FIG. 17 is a block diagram of an example SoC 1700 that includes a FRAM array with cross-point platelines, as described in more detail above. In this example, SoC 1700 is a wireless sensor that may be used for gathering information. Sensor node 1700 includes a microcontroller (MCU) 1710 coupled to a communications interface 1720. MCU 1710 may include an FRAM storage module 1714, a static random access memory 1715, one or more timer modules 1716, and other various interfaces for coupling to communications interface 1720, display 1730, and sensors 1740, 1742, for example.

MCU 1710 may be embodied as an MSP430FR57xx available from Texas Instruments, for example. The Texas Instruments MSP430FR57xx family of ultralow-power microcontrollers includes multiple devices featuring embedded FRAM nonvolatile memory, ultralow power 16-bit MSP430 CPU, and different peripherals targeted for various applications.

In this example, FRAM 1714 provides 16 kB of storage, SRAM 1715 provides 1 KB of storage, CPU 1712 is a 16-Bit RISC Architecture that operates at speeds up to 8-MHz However, other embodiments may include other types of CPU and different memory capacities. Since the FRAM is non-volatile, an application program may be stored within FRAM 1714 for execution by CPU 1712. A portion of FRAM 1714 may also be allocated for use as a data memory to store data that is collected from sensors 1740, 1742. Since FRAM does not have the write restrictions associated with Flash non-volatile memory, FRAM 1714 may be used as a scratch pad memory during processing of the collected sensor data, for example.

Communications interface 1720 may include a transmitter and a receiver for wireless communication with an external controller. Interface 1720 may communicate using RF standards such as ZigBee, which is popular in low data rate, low power applications, for example. Interface 1720 may be embodied as a CC3000-TiWI-SL module, available from Texas Instruments, for example.

Display 1730 may be a simple set of LEDs (light emitting diodes), or a more complex LCD (liquid crystal display), for example. In some embodiments, display 1730 may be omitted.

This example includes a flow sensor 1740 for sensing liquid flow rates and two temperature sensors 1742 for sensing air temperature. However, various embodiments may include a wide range of known or later developed sensors that may be used to collect various types of environmental data. This example of MCU 1710 includes a 200-ksps 10-bit ADC and two op-amps that may be used to gather and process environmental data from sensor 1740, 1742, for example.

Battery 1750 provides power to MCU 1710, communication interface 1720, display 1730, and sensors 1740, 1742. Power management (PM) logic 1718 may be included within MCU 1710, or it may be separate.

Other Embodiments

Although the invention finds particular application to microcontrollers (MCU) implemented, for example, in a System on a Chip (SoC), it also finds application to other forms of processors and integrated circuits. A SoC may contain one or more modules which each include custom designed functional circuits combined with pre-designed functional circuits provided by a design library.

While example arrays were illustrated with an example row length in a range of 300-400 bits and number of rows, other embodiments may include more or few bits per row and more or fewer rows per array. While an example having 32 bit words and 8× multiplexing was illustrated and described, other embodiments may have various combinations of word size and multiplexing factors. While an example was illustrated in which the plateline drivers, bitline drivers and sense amps all used an 8× multiplex factor, other embodiments may use different multiplex factors for plateline drivers, sense amps, and bitline drivers, for example.

While the invention has been described with reference to illustrative embodiments, this description is not intended to be construed in a limiting sense. Various other embodiments of the invention will be apparent to persons skilled in the art upon reference to this description. For example, other fixed, portable, or mobile systems such as remote controls, access badges and fobs, smart credit/debit cards and emulators, smart phones, digital assistants, and any other now known or later developed portable or embedded system may embody FRAM arrays as described herein that make use of column oriented platelines to improve density and reduce access time.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system on chip (SoC) comprising an array of bit cells, wherein the array comprises:
    a plurality of bit cells organized into a plurality of rows and columns;
    a plurality of word lines, wherein each row of bit cells has one of the plurality of word lines connected to each bit cell in the row of bit cells;
    a plurality of platelines, wherein each column of bit cells has one of the plurality of platelines connected to each bit cell in the column of bit cells; and
    a plurality of bitlines, wherein each column of bit cells has one of the plurality of bitlines connected to each bit cell in the column of bit cells;
    wherein each bit cell of the plurality of bits cells comprises a non-volatile storage device connected in series with a pass gate, wherein a terminal of the non-volatile storage device is coupled to one of the plurality of bitlines, a terminal of the pass gate is coupled to one of the plurality of platelines, and a control terminal of the pass gate is coupled to one of the plurality of word lines.

2. The SoC of claim 1, wherein the non-volatile storage device is a ferroelectric capacitor.

3. A system on chip (SoC) comprising an array of bit cells, wherein the array comprises:
    a plurality of bit cells organized into a plurality of rows and columns;
    a plurality of word lines, wherein each row of bit cells has one of the plurality of word lines connected to each bit cell in the row of bit cells;
    a plurality of platelines, wherein each column of bit cells has one of the plurality of platelines connected to each bit cell in the column of bit cells; and
    a plurality of bitlines, wherein each column of bit cells has one of the plurality of bitlines connected to each bit cell in the column of bit cells;
    wherein each of the plurality of bit cells is a duplex bit cell, further comprising:
    wherein each column of bit cells has a pair of the plurality of platelines connected respectively to each side of the duplex bit cell in the column of bit cells; and
    wherein each column of bit cells has a pair of the plurality of bitlines connected respectively to each side of the duplex bit cell in the column of bit cells.

4. The SoC of claim 3, further comprising:
    a plurality of duplex bitline drivers, wherein each one of the plurality of duplex bitline drivers is coupled a selection circuit and thereby to a subset of the plurality of bitlines; and
    a plurality of duplex plateline drivers, wherein each one of the plurality of duplex plateline drivers is coupled a selection circuit and thereby to a subset of the plurality of platelines.

5. The SoC of claim 3, further comprising:
    a plurality of sense amps, wherein each one of the plurality of sense amps is coupled a selection circuit and thereby to a subset of the plurality of duplex bitlines.

6. A method for operating an array of memory bit cells, the method comprising:
    selecting of row of bit cells in an array organized as rows and columns by asserting a word line coupled to each bit cell in the selected row of bit cells;

selecting a portion of bit cells in the selected row by enabling a subset of column oriented platelines, wherein each column of the array has a separate plateline; and reading data from each bit cell of the selected portion of bit cells by activating a set of sense amps coupled to bitlines of the selected portion of bit cells;

wherein the memory bit cells are duplex bit cells configured to store two complimentary values; and wherein writing data into each duplex bit cell of the selected portion of duplex bit cells comprises writing complimentary data into each duplex bit cell simultaneously by activating a first associated plateline and bitline in a first polarity to write a first logic level to a first portion of the duplex bit cell while activating a second associated plateline and bitline in a second polarity to write a second logic level to a second portion of the duplex bit cell.

* * * * *